United States Patent
Noshiro

(10) Patent No.: US 6,291,291 B1
(45) Date of Patent: Sep. 18, 2001

(54) SEMICONDUCTOR DEVICE AND METHOD OF MANUFACTURING THE SAME

(75) Inventor: Hideyuki Noshiro, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/546,711

(22) Filed: Apr. 10, 2000

Related U.S. Application Data

(62) Division of application No. 09/124,218, filed on Jul. 29, 1998, now Pat. No. 6,060,736.

(30) Foreign Application Priority Data

Feb. 3, 1998 (JP) .................................................. 10-021666

(51) Int. Cl.$^7$ ............................................. H01L 21/8242
(52) U.S. Cl. ......................... 438/240; 438/250; 438/253; 438/393; 438/396
(58) Field of Search ................................... 438/386–399, 438/239–256

(56) References Cited

U.S. PATENT DOCUMENTS

| | | | |
|---|---|---|---|
| 5,453,294 | * 9/1995 | Ogi et al. | 427/100 |
| 5,650,362 | * 7/1997 | Nashimoto | 427/126.3 |
| 5,719,417 | 2/1998 | Roeder et al. | |
| 5,998,236 | * 12/1999 | Roeder et al. | 438/104 |
| 6,013,970 | * 1/2000 | Nishiwaki et al. | 310/330 |
| 6,090,443 | * 7/2000 | Eastep | 427/255.32 |
| 6,121,647 | * 9/2000 | Yano et al. | 257/295 |

FOREIGN PATENT DOCUMENTS

| | | | |
|---|---|---|---|
| 406116093 | * 4/1994 | (JP) | 427/250 |
| 40635154 | * 12/1994 | (JP) | |
| 8-139307 | 5/1996 | (JP) | |
| 409298324 | * 11/1997 | (JP) | |

OTHER PUBLICATIONS

Roeder et al., Liquid delivery MOCVD of ferroelectric PZT, 1996, Mater. Res. Soc, 415, 123–128.*

Patel et al., Pyroelectric properties of lead based ferroelectric thin films, 1993, Mater. Res. Soc, 310, 53–58.*

Karasawa et al., Ultra–thin lead titanate films prepared by tripole magnetron sputtering, 1996, Integrated Ferroelectrics, 12, 105–114.*

Song et al., Structural and Ferroelectric Properties of R.F. Magnetron Sputtered SrBi2Ta2O9 Thin Films, 1996, IEE, 1, 475–478.*

* cited by examiner

Primary Examiner—Eddie Lee
Assistant Examiner—Paul E Brock, II
(74) Attorney, Agent, or Firm—Armstrong, Westerman, Hattori, McLeland & Naughton, LLP

(57) ABSTRACT

The present invention is a semiconductor device having a capacitor employing ferroelectrics as a capacitor insulating film. The semiconductor device comprises a semiconductor substrate 11, an insulating film 12 formed on the semiconductor substrate 11, and a capacitor including (a) a lower electrode formed on the insulating film and made of a refractory metal whose face orientation (111) appears on an upper surface thereof, (b) a capacitor insulating film formed on the lower electrode and made of at least two layers consisting of a ferroelectrics film including Pb having a face orientation (111) and a ferroelectrics film including Pb having a face orientation (100), and (c) an upper electrode 15 formed on the capacitor insulating film 14.

20 Claims, 10 Drawing Sheets

(a)

(b)

SEMICONDUCTOR DEVICE AND METHOD OF MANUFACTURING THE SAME

This application is a division of U.S. application Ser. No. 09/124,218, U.S. Pat. No. 6,060,736 filed Jul. 29, 1998.

BACKGROUND OF THE INVENTION

1. Field of the Invention

The present invention relates to a semiconductor device and a method of manufacturing the same and, more particularly, a semiconductor device having a capacitor employing ferroelectrics as a capacitor insulating film and a method of manufacturing the same.

2. Description of the Prior Art

In recent years, in the semiconductor integrated circuit device, miniaturization of a capacitor has been requested according to the high integration density.

Then, in the prior art, an application of material (ferroelectrics, etc.) such as $(Sr,Ba)TiO_3$, $Pb(Zr,Ti)O_3$, or the like having a high dielectric constant to a capacitor insulating film of a semiconductor memory device has been expected. Meanwhile, in order to increase an integration degree of DRAM, etc., it is effective to reduce an area of the capacitor. In this case, if a ferroelectrics film which has the high dielectric constant rather than a silicon oxide film, a silicon nitride film, etc. in the prior art is employed as the capacitor insulating film, the area of the capacitor can be reduced. As shown in FIG. 13, normally the ferroelectrics have a perovskite crystal structure and are distinguished into an A site and a B site according to their orientation locations. In $(Sr, Ba)TiO_3$ and $Pb(Zr,Ti)O_3$, Sr and Ba, or Pb are oriented at the A site respectively and Ti, or Zr and Ti are oriented at the B site respectively.

FIGS. 1A and 1B are sectional views showing a method of forming a capacitor using the ferroelectrics as the capacitor insulating film in the prior art.

As shown in FIG. 1A, an insulating film 2 is formed on a semiconductor substrate 1 and then a two-layered metal film 3 consisting of a Ti film 301 and a Pt film 302 formed on the Ti film 301 is formed.

Then, a ferroelectrics film 4 made of $(Pb,La)(Zr,Ti)O_3$ (referred to as "PLZT" hereinafter) is formed and then a Pt film 5 is formed.

Then, as shown in FIG. 1B, an upper electrode 5a made of the Pt film, a capacitor insulating film 4a made of the PLZT film, and a lower electrode 3a made of the two-layered metal film 3 consisting of the Ti film 301 and the Pt film 302 are formed by patterning these films in order of the Pt film 5, the PLZT film 4, and the Ti/Pt film 3 separately. With the above, the capacitor has been completed.

Since the capacitor formed as above has employed the ferroelectrics film as the capacitor insulating film 4a, the area of the capacitor can be reduced and thus such ferroelectrics film would be desired for miniaturization of the device.

However, in the capacitor employing the above material having a high dielectric constant as the capacitor insulating film 4a, the characteristics of the capacitor are changed considerably if the composition is changed.

In other words, there have been the problems that, if the particular composition is employed, the leakage current can be reduced smaller but the hysteresis loop is also reduced smaller. In contrast, there has been the problem that, if the hysteresis loop is enhanced by changing the composition, the leakage current would be increased inevitably.

SUMMARY OF THE INVENTION

It is an object of the present invention to provide a semiconductor device which is capable of suppressing a leakage current of a capacitor using ferroelectrics material as a capacitor insulating film and also enhancing the hysteresis characteristic and a method of manufacturing the same.

In the present invention, a capacitor insulating film which is formed by laminating a ferroelectrics film including lead (Pb) having a face orientation (111) and a ferroelectrics film including Pb having a face orientation (100) is employed.

In the meanwhile, the inventors of the present invention have found that a Pb content can be controlled by adjusting film forming conditions such as a flow rate of a sputter gas, a power for plasmanizing the sputter gas, etc. and that a face orientation can be changed in terms of the change in the Pb content. In the case of PLZT, La as well as Pb may be employed as elements oriented at A sites, but especially Pb of such elements has a larger effect on the control of face orientation.

In addition, according to the experiment, in the ferroelectrics film including Pb having the face orientation (111), the leakage current is large but the polarization width also becomes large whereas, in the ferroelectrics film including Pb having the face orientation (100), the polarization width is small but the leakage current also becomes small.

It is preferable that a ratio of elements including Pb oriented at A sites of a perovskite crystal structure, which are constituent elements of the ferroelectrics film in practical use, to other constituent elements should be set in a range of 0.9 to 1.4 from viewpoints of a leakage current and a polarization width. In this case, the reason of that a lower limit is set to 0.9 is due to that deficits of the elements including Pb of the ferroelectrics film oriented at A sites become remarkable if the lower limit is set less than 0.9.

The A site denotes an A site in a perovskite crystal structure shown in FIG. 13. In $Pb(Zr,Ti)O_3$ or $(Pb,La)(Zr,Ti)O_3$, Pb or Pb and La are orientated at the A sites respectively.

Accordingly, in the capacitor formed by laminating these ferroelectrics films, since the capacitor includes the ferroelectrics film having the face orientation (111), it has the large polarization width.

In the meanwhile, if the ferroelectrics film having the face orientation (111) is employed solely in the capacitor, it has the large leakage current. In the present invention, the defect of the ferroelectrics film having the face orientation (111), i.e., the ferroelectrics film has the large leakage current, can be compensated by laminating the ferroelectrics film having the face orientation (111) and the ferroelectrics film having the face orientation (100). As a result, the leakage current can be reduced smaller in the overall capacitor.

With the above, the capacitor having the large polarization width can be formed while reducing the leakage current smaller.

In the semiconductor memory device having such capacitor, an outflow of charges can be suppressed because the capacitor has the small leakage current. In addition, since the polarization width is large, the dielectric constant of the capacitor insulating film can be enhanced and also miniaturization of the device can be achieved by reducing the capacitor area.

DESCRIPTION OF THE PREFERRED EMBODIMENTS

Embodiments of the present invention will be explained with reference to the accompanying drawings hereinafter.

(1) Examination Result

The cause of the large leakage current and the cause of the small hysteresis loop have been examined hereunder. Results of the examination will be discussed in the following.

Figure 13:
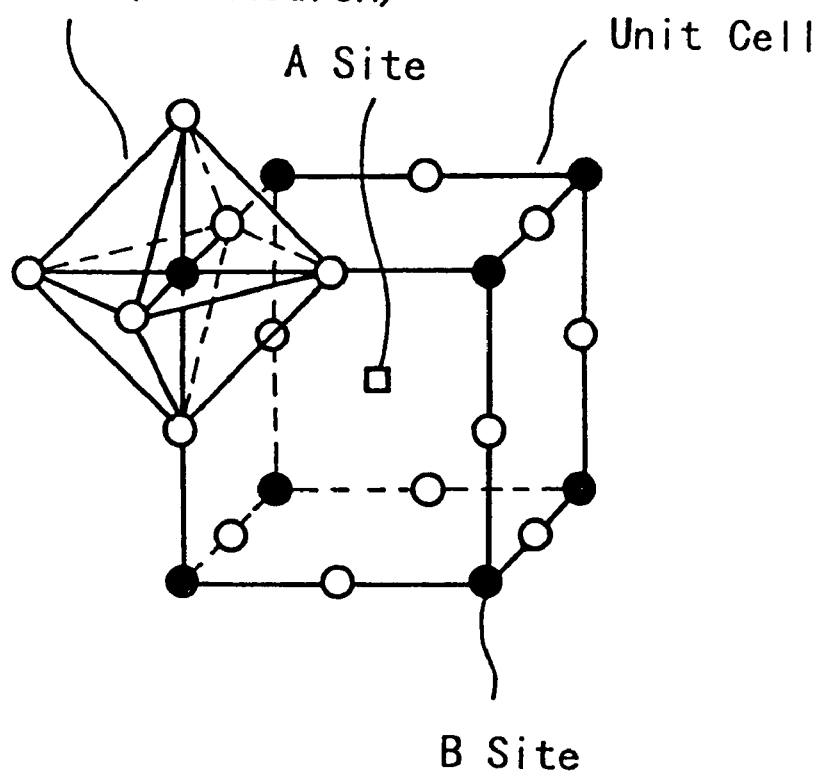
FIG. 13 is a view showing a perovskite crystal structure of a ferroelectrics used as the capacitor insulating film.

A crystal orientation (crystal coordination) of the ferroelectrics including Pb such as the PLZT film can be changed based on a Pb+La content which are coordinated at A sites of a perovskite crystal structure shown in FIG. 13 and such Pb+La content can be changed according to process conditions. Also, it has been found that the change of the crystal orientation has an effect on the leakage current and the hysteresis loop.

Figure 12:
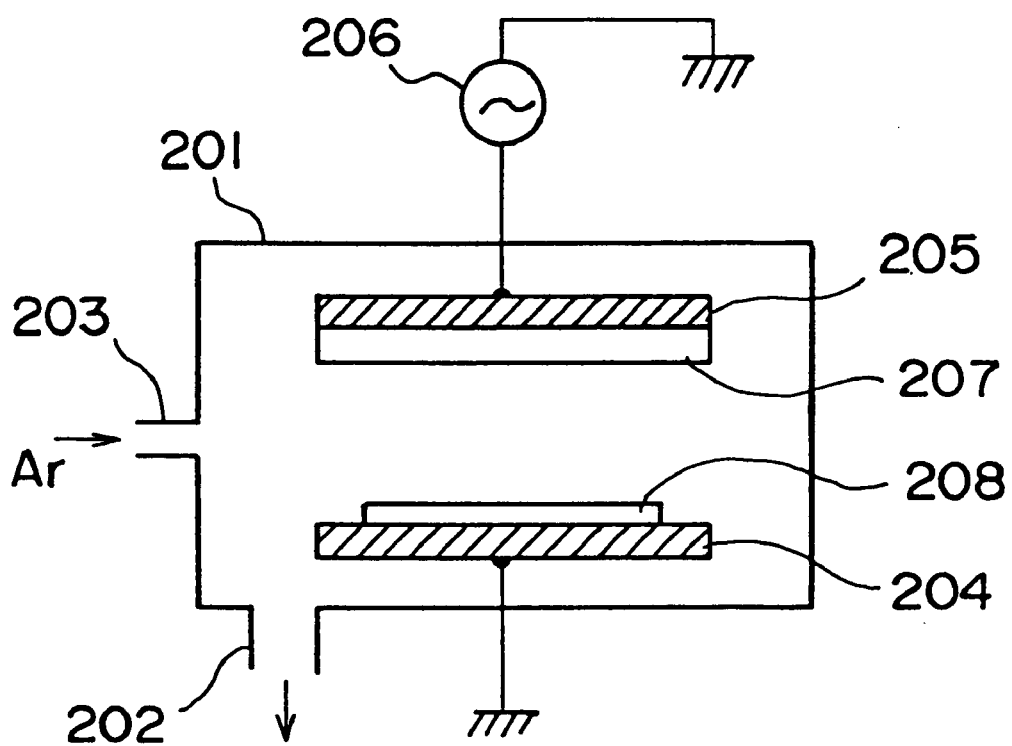
FIG. 12 is a schematic sectional view showing a sputtering equipment used in the method of forming the capacitor according to the embodiment of the present invention.

FIG. 12 is a sectional view showing a sputtering equipment which is used to form upper and lower electrodes and a capacitor insulating film of a capacitor. As shown in FIG. 12, the sputtering equipment includes the upper and lower electrodes 205, 204 in a chamber 201. A sputter gas such as Ar is introduced from a gas introducing port 203 and a gas in the chamber 201 is exhausted until a pressure in the chamber 201 is reduced to a predetermined pressure. A high frequency power supply 206 is connected to the upper electrode 205 to plasmanize the sputter gas.

In addition, a target 207 as film forming material is attached onto the upper electrode 205 of the sputtering equipment, and also a substrate 208 on which films are to be formed is loaded on the lower electrode 204 of the sputtering equipment.

Figure 3:
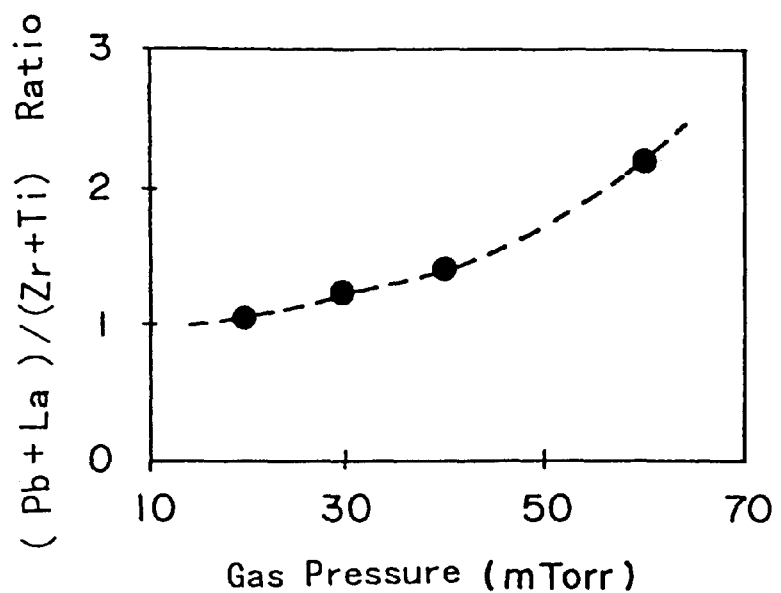
FIG. 3 is a graph showing the result of an experiment in which a Pb+La content in a capacitor insulating film is controlled by adjusting a flow rate of Ar gas according to the embodiment of the present invention.

FIG. 3 shows the change in the Pb+La content in the capacitor insulating film relative to a gas pressure in forming the PLZT film by virtue of the above sputtering equipment. An abscissa denotes the gas pressure (mTorr) represented on a linear scale while an ordinate denotes a (Pb+La)/(Zr+Ti) ratio represented on a linear scale.

According to FIG. 3, the (Pb+La)/(Zr+Ti) ratio is increased with the increase of the gas pressure. The ratios are about 1, 1.2, 1.4, and 2.2 at measuring points of 20, 30, 40, and 60 (mTorr) respectively.

Figure 4:
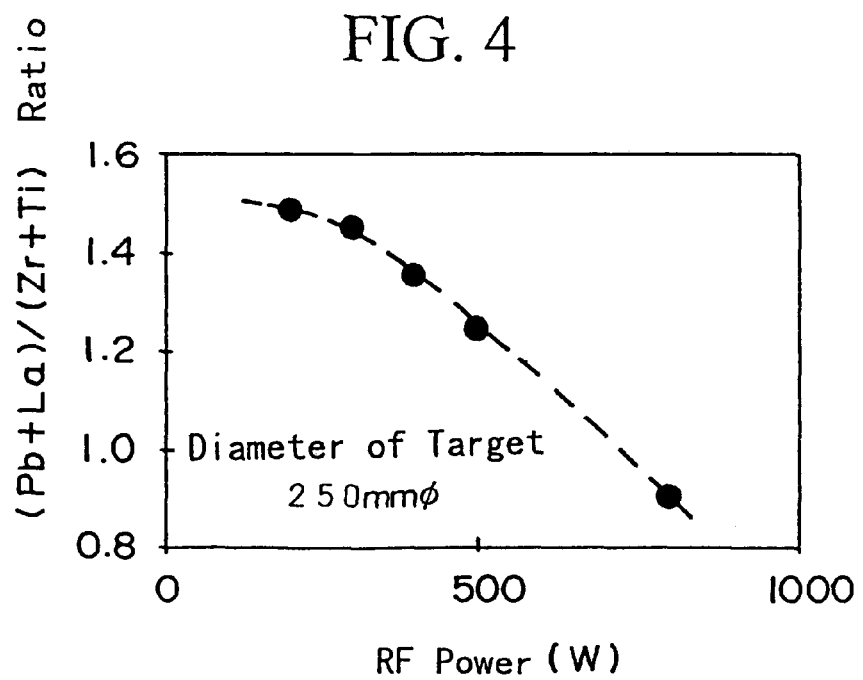
FIG. 4 is a graph showing the result of an experiment in which the Pb+La content in the capacitor insulating film is controlled by adjusting a plasmanizing power according to the embodiment of the present invention.

FIG. 4 shows the change in the Pb+La content relative to RF power in forming the PLZT film. An abscissa denotes the RF power (W) represented on a linear scale while an ordinate denotes the (Pb+La)/(Zr+Ti) ratio represented on a linear scale. A target having a diameter of 250 mm$\phi$ is employed.

As shown in FIG. 4, the (Pb+La)/(Zr+Ti) ratio is reduced with the increase of the RF power. The ratios are about 1.47, 1.43, 1.35, 1.22, and 0.9 at measuring points of 200, 300, 400, 500, and 800 (W) respectively.

Figure 7:
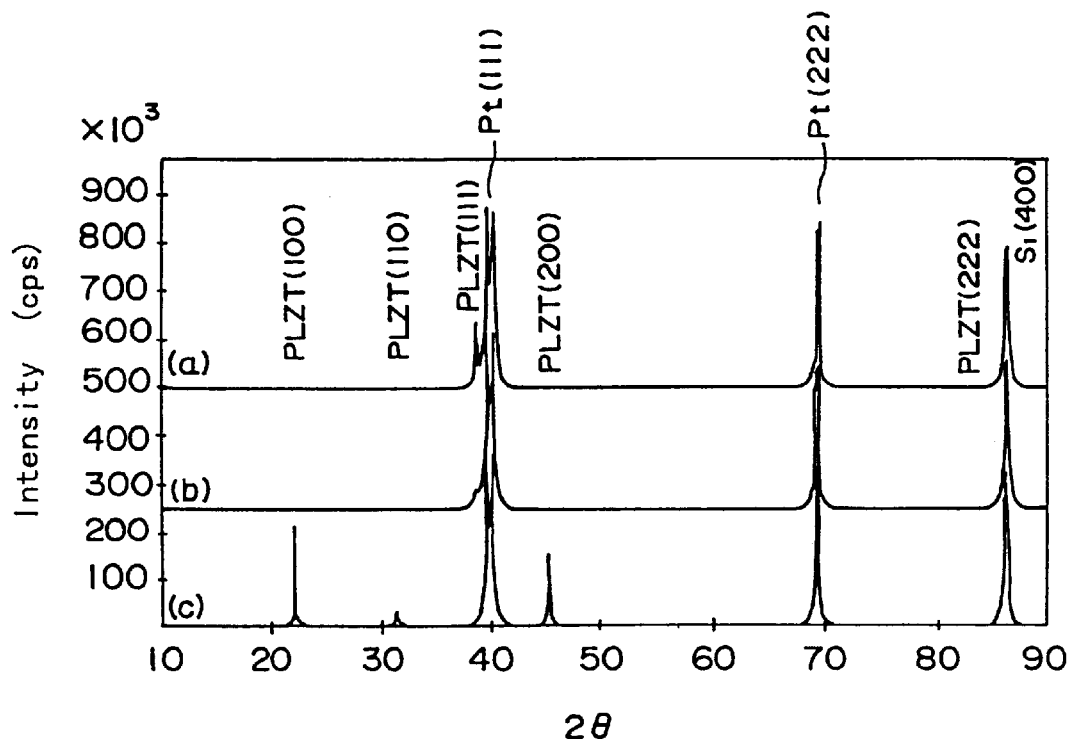
FIG. 7 is a graph showing correlations between the Pb+La content in the capacitor insulating film and crystal orientation according to the embodiment of the present invention.
Figure 7:
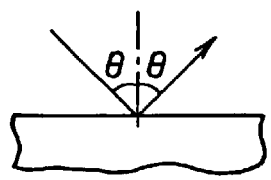

FIG. 7 shows the examination result of the crystal orientation of the PLZT film by virtue of X-ray diffraction when the PLZT film is changed variously in the Pb+La content. An abscissa denotes a twice angle 2θ (degree) of an incident angle of the X-ray into a sample while an ordinate denotes diffraction intensity ($\times 10^3$ cps). In FIG. 7, a sample (a) has the (Pb+La)/(Zr+Ti) ratio of less than 1, a sample (b) has the (Pb+La)/(Zr+Ti) ratio of 1.2, and a sample (c) has the (Pb+La)/(Zr+Ti) ratio of 1.4.

It may be believed that the above tendency can be brought about by a Pb(Zr, Ti)O$_3$ film (referred to as a "PZT" film hereinafter) including Pb other than the PLZT film.

According to the experiment by the inventors of the present invention, it has been found that the Pb content has an large effect on the crystal orientation (crystal coordination) in the ferroelectrics including Pb such as the PLZT film. In other words, this is because the Pb content is changed according to process conditions in film formation and then the crystal orientation is changed due to the Pb content.

More particularly, as shown by the result (a) in FIG. 7, if the (Pb+La)/(Zr+Ti) ratio is less than 1, orientations such as a (111) face orientation, a (222) face orientation equivalent to the (111) face orientation, etc. become dominant. In contrast, as shown by the result (c) in FIG. 7, if the (Pb+La)/(Zr+Ti) ratio is in excess of 1, orientations such as a (100) face orientation, a (200) face orientation equivalent to the (100) face orientation, etc. become dominant.

Changes in the leakage current and the hysteresis loop of the capacitor due to differences in the above crystal orientation have been examined.

According to the results, the PLZT film is to have a (111) face orientation and a polarization width (2Pr) of the hysteresis loop as large as 25 $\mu$C/cm$^2$ or so when the Pb+La content is small such that the (Pb+La)/(Zr+Ti) ratio is less than 1. However, the leakage current is increased because of the deficit of Pb+La in the PLZT film. Hence, it is preferable that the (Pb+La)/(Zr+Ti) ratio is more than 0.9 in practical use level.

Further, when the Pb+La content is large such that the (Pb+La)/(Zr+Ti) ratio is more than 1, the orientation film having the face orientation of (100) as described above can be formed and can be reduced in the leakage current. But the polarization width of the hysteresis loop is as small as 10 $\mu C/cm^2$ or so. It is preferable that the (Pb+La)/(Zr+Ti) ratio is less than 1.4 in practical use level.

In the above, difference in the polarization width is caused because the magnitude of polarization in the ferroelectrics is changed based on the crystal orientation.

From the above experiment, it is possible to say that, if the ferroelectrics film such as the PLZT film, the PZT film, etc. is employed as the capacitor insulating film, preferably a ratio of elements oriented at the A site related to (Zr+ti) should be set in the range of 0.9 to 1.4 from feature aspects of both the leakage current and the polarization width.

(2) Embodiments

Figure 1A:
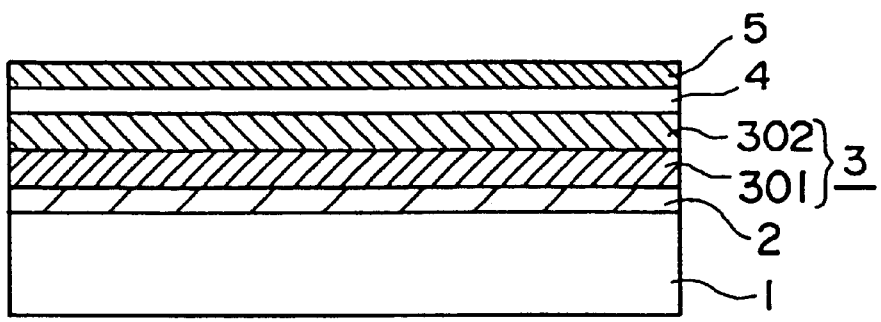
FIGS. 1A and 1B are sectional views showing a method of forming a capacitor in the prior art.
Figure 1B:
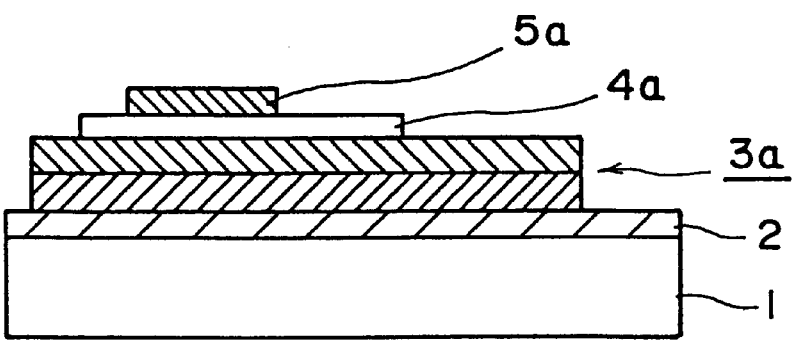
Figure 2A:
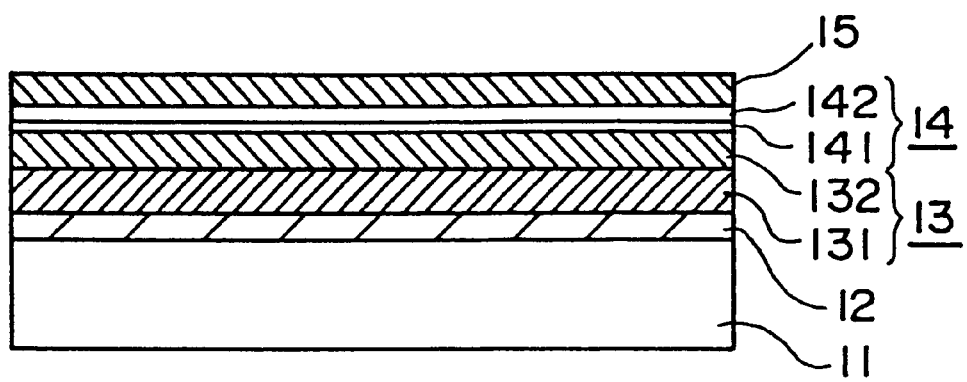
FIGS. 2A and 2B are sectional views showing a method of forming a capacitor according to an embodiment of the present invention.
Figure 2B:
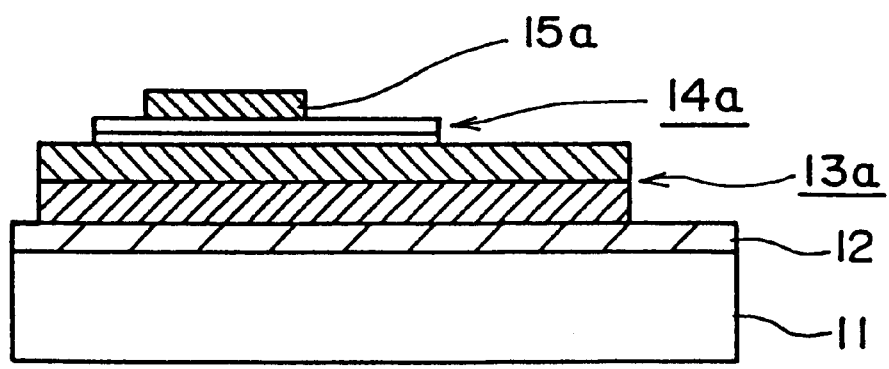

FIGS. 2A and 2B are sectional views showing a method of forming a capacitor according to an embodiment of the present invention respectively. The equipment shown in FIG. 12 is employed as the sputtering equipment.

First, as shown in FIG. 2A, a silicon substrate 11 is oxidized by thermal oxidation and then a silicon oxidation film 12 of about 200 nm thickness is formed on a surface of the silicon substrate 11.

Then, a Ti film 131 of 20 nm thickness is formed by carrying out the sputtering for ten minutes under the conditions of the Ar gas pressure of 10 mTorr and the RF power of 1.0 KW (1.416 $W/cm^2$). Then, a Pt film 132 of 100 nm thickness is formed on the Ti film 131 by carrying out the sputtering for twenty minutes under the conditions of the Ar gas pressure of 10 mTorr and the DC power of 1.0 KW (1.416 $W/cm^2$). Thereby, a lower electrode 13 made of two-layered metal film is formed.

Under such conditions of forming the Pt film 132, the (111) face orientation appears on an upper surface of the Pt film 132. The reason for this is that the face orientation (111) of the upper surface of the Pt film 132 enables the PLZT film having the crystal face orientation (111) to be formed easily on the Pt film 132 by succeeding steps.

Then, a PLZT film 141 of 50 nm thickness is formed by carrying out the sputtering for two minutes under the conditions of the Ar gas pressure of 10 mTorr, the RF power of 0.5 KW (0.708 $W/cm^2$), and T/S of 70 mm. Under these conditions, as shown in FIG. 3, a Pb/(Zr+Ti) ratio is about 0.9 and the PLZT film 141 has the (111) face orientation. Where the T/S means a distance between a surface of the target 207 and a surface of the sample stage 204 in FIG. 12.

In turn, a PLZT film 142 of 250 nm thickness is formed by carrying out the sputtering for thirteen minutes under the conditions of the Ar gas pressure of 35 mTorr, the RF power of 0.5 KW (0.708 $W/cm^2$), and T/S of 70 mm. Under the above conditions, as shown in FIG. 3, a (Pb+La)/(Zr+Ti) ratio is about 1.3 and the PLZT film 142 has the (100) face orientation.

Accordingly, a capacitor insulating film 14 made of two-layered PLZT films 141, 142 each having different orientation is formed.

In the above, the Ar gas pressure has been changed to form the capacitor insulating film 14 made of two-layered PLZT films 141, 142, but the RF power may be changed. For example, the lower layer may be formed by carrying out the sputtering for thirty seconds under the conditions of the Ar gas pressure of 35 mTorr, the RF power of 0.8 KW (1.132 $W/cm^2$), and T/S of 70 mm, whereas the upper layer may be formed by carrying out the sputtering for thirteen minutes under the conditions of the Ar gas pressure of 35 mTorr, the RF power of 0.5 KW (0.708 $W/cm^2$), and T/S of 70 mm.

Next, the PLZT films 141, 142 are annealed at the temperature of 800° C. for 20 seconds in oxygen atmosphere.

Then, a Pt film 15 of 100 nm thickness serving as an upper electrode is formed by carrying out the sputtering for twenty minutes under the conditions of the Ar gas pressure of 10 mTorr and the DC power of 1.0 KW (1.416 $W/cm^2$)

In turn, these films are patterned separately in order of the films 15, 14, and 13. In this case, respective layers are formed by ion milling under following conditions.

More particularly, an upper electrode 15a is formed by patterning the Pt film 15 by carrying out the ion milling for three minutes under the conditions of the Ar gas pressure of 0.2 mTorr and the plasmanizing power of 1 KW. Subsequently, a capacitor insulating film 14a is formed by patterning the PLZT film 14 by carrying out the ion milling for five minutes under the conditions of the Ar gas pressure of 0.2 mTorr and the plasmanizing power of 1 KW. Next, a lower electrode 13a is formed by patterning the two-layered metal film 13 made of Pt film/Ti film by carrying out the ion milling for three minutes under the conditions of the Ar gas pressure of 0.2 mTorr and the plasmanizing power of 1 KW. In this manner, the capacitor has been finished.

Next, the examination result of the Pb+La content in the PLZT films with different orientations in the above capacitor insulating film by the SIMS analysis method will be explained hereunder.

Figure 8:
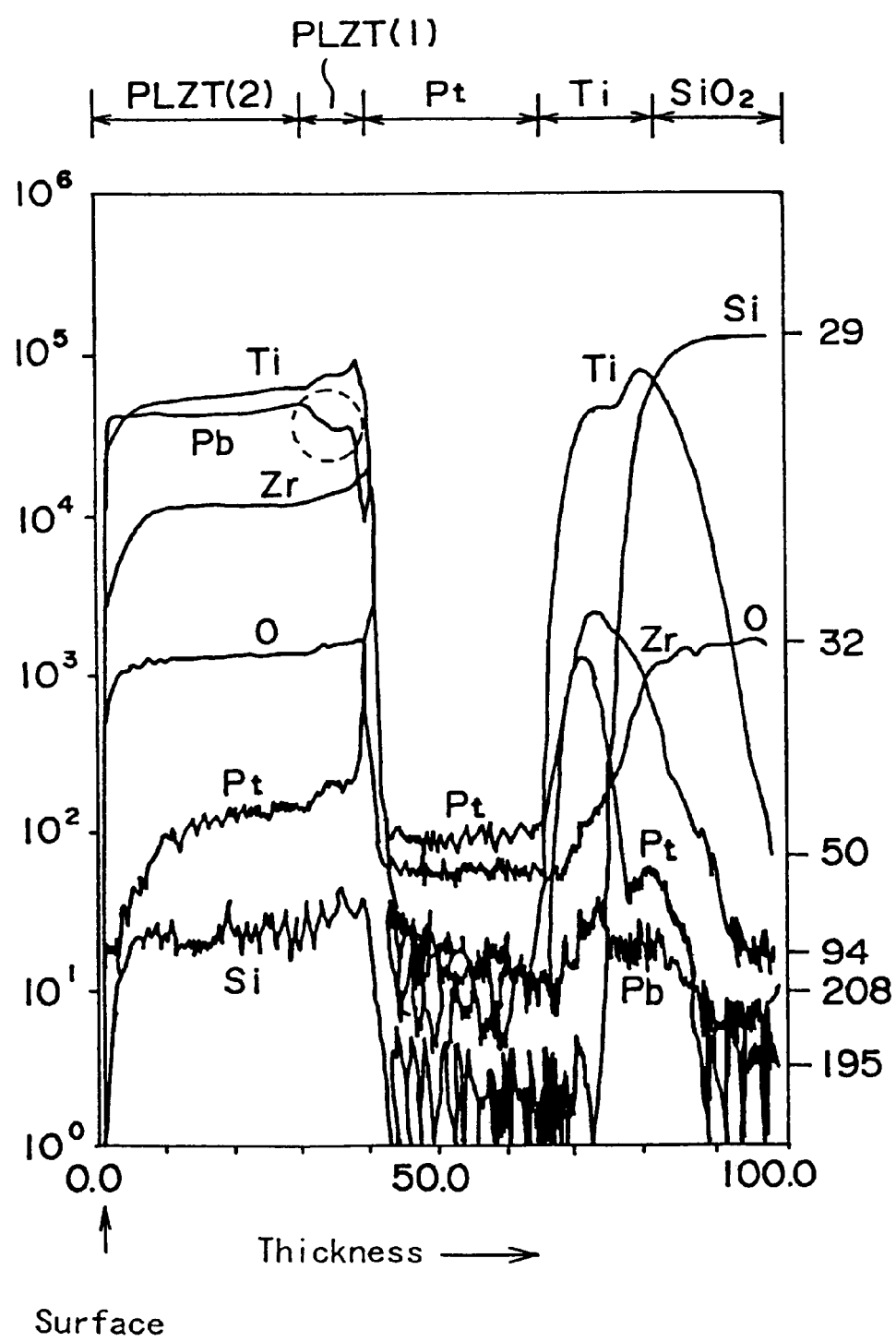
FIG. 8 is a graph showing the examination result of a distribution of a Pb content in the capacitor insulating film according to the embodiment of the present invention.
Figure 9:
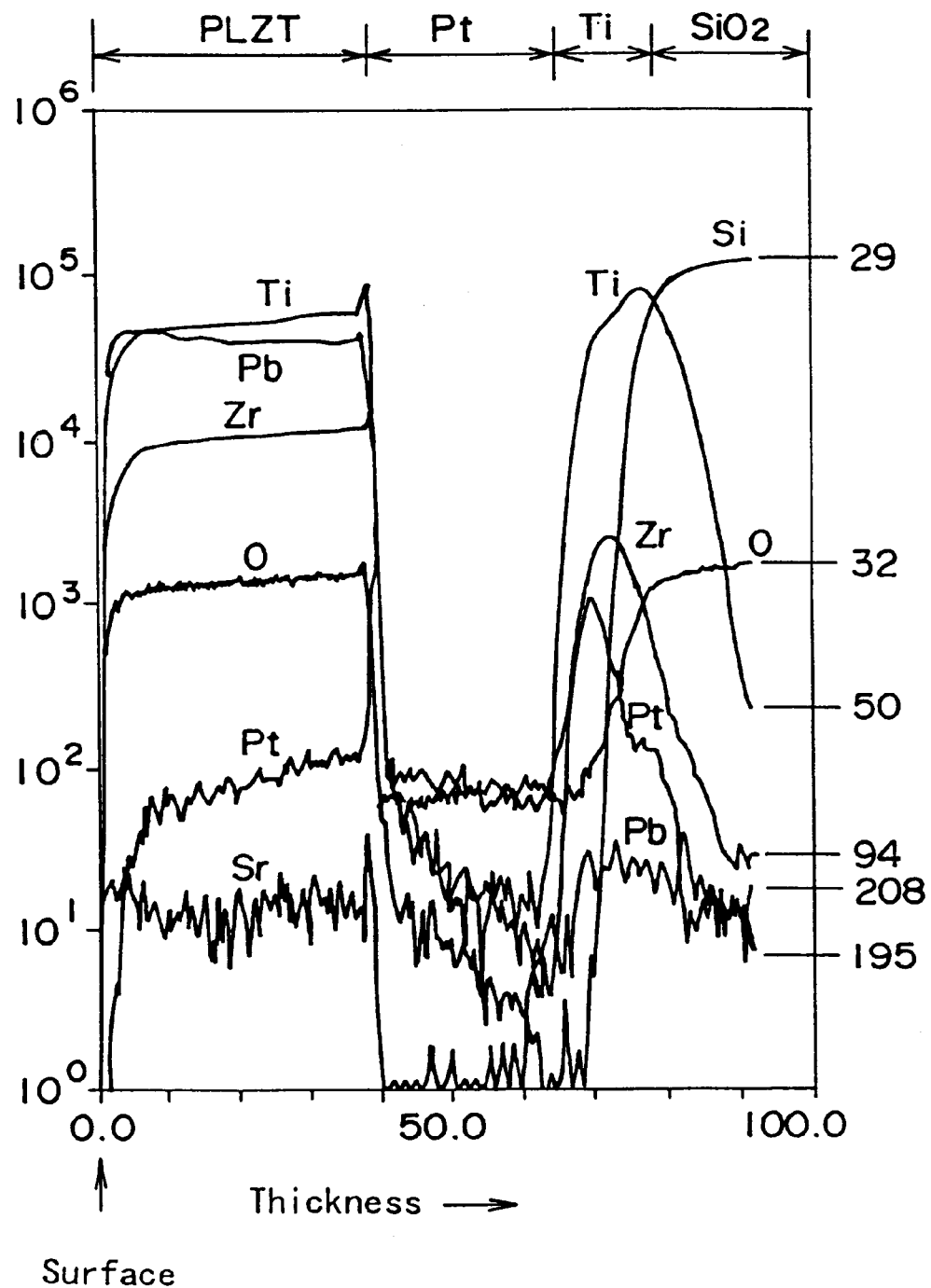
FIG. 9 is a graph showing the examination result of the distribution of the Pb content in the capacitor insulating film according to a comparative example.

The examination result is shown in FIG. 8. For comparison's sake, the examination result of the comparative example is shown in FIG. 9. In FIGS. 8 and 9, an abscissa denotes a thickness and an ordinate denotes a relative intensity. In the comparative example, the PLZT film of 250 nm thickness, which is formed by carrying out the sputtering for thirteen minutes under the conditions of the Ar gas pressure of 35 mTorr, the RF power of 0.5 KW (0.708 $W/cm^2$), and the T/S of 70 mm, has been employed as the capacitor insulating film.

As shown in FIG. 8, Pb can be reduced in a portion of the PLZT film enclosed with a dotted line circle in the neighborhood of the Pt film rather than other portions. This suggests the fact that the face orientation of the PLZT film adjacent to the Pt film is (111) and as a result the face orientation of the PLZT film formed thereon is (100). This can be seen clearly by comparing the result in FIG. 8 with the comparative example in FIG. 9.

Furthermore, the hysteresis curves and the leakage currents of the above capacitor have been examined. For comparison's sake, the comparative sample has also been examined. As the capacitor insulating film of the comparative sample, the PLZT film of 250 nm thickness has been formed by carrying out the sputtering for thirteen minutes under the conditions of the Ar gas pressure of 35 mTorr, the RF power of 0.5 KW (0.708 $W/cm^2$), and the T/S of 70 mm.

Figure 5:
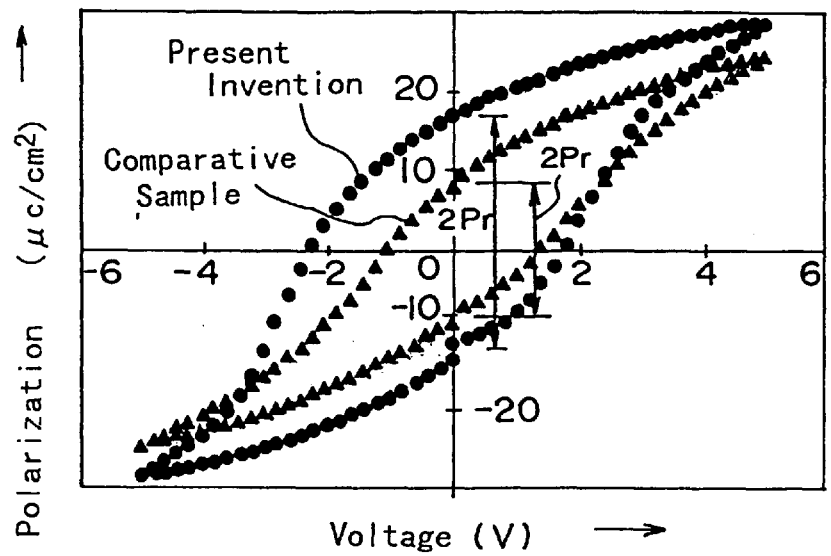
FIG. 5 is a graph showing hysteresis curves of a capacitor having the capacitor insulating film according to the embodiment of the present invention.
Figure 6:
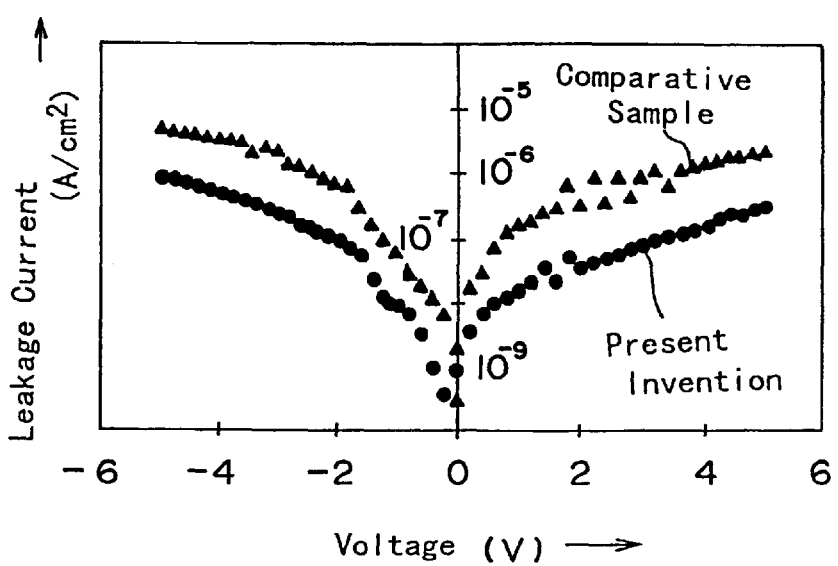
FIG. 6 is a graph showing leakage currents of the capacitor having the capacitor insulating film according to the embodiment of the present invention.

The above examination results are shown in FIGS. 5 and 6.

FIG. 5 shows hysteresis curves relative to applied voltage to the PLZT film. An abscissa denotes the applied voltage (V) and an ordinate denotes polarization ($\mu C/cm^2$).

As shown in FIG. 5, the sample of the present invention had large hysteresis and a polarization width (2Pr) is 29 ($\mu C/cm^2$) after 5 V has been applied to the capacitor. In contrast, in the case of the comparative sample, the polarization width (2Pr) is about 18 ($\mu C/cm^2$).

FIG. 6 shows the leakage currents relative to the applied voltage to the PLZT film. An abscissa denotes the applied voltage (V) and an ordinate denotes the leakage current (A/cm$^2$).

As shown in FIG. 6, the sample of the present invention has the small leakage current rather than the comparative sample.

As described above, according to the capacitor of the embodiment of the present invention, the capacitor insulating film made of the PLZT film which is formed by laminating two layers having different orientations, i.e., the PLZT film 141 with the face orientation (111) and the PLZT film 142 with the face orientation (100) has been employed.

By the way, the PLZT film 141 with the face orientation (111) has the large polarization width but the leakage current is also large. While, the PLZT film 142 with the face orientation (100) has the small leakage current but the polarization width is also small.

Therefore, the capacitor formed by laminating these PLZT films 141, 142 has the large polarization width because it includes the PLZT film 141 with the face orientation (111).

The PLZT film 141 with the face orientation (111) has the large leakage current if it is employed solely in the capacitor. The defect of the PLZT film 141 with the face orientation (111), i.e., the PLZT film 141 has the large leakage current, can be compensated by laminating the PLZT film 141 with the face orientation (111) and the PLZT film 142 with the face orientation (100), so that the leakage current can be reduced smaller in the overall capacitor.

As a consequence, the capacitor having the large polarization width can be formed while reducing the leakage current smaller.

Figure 10:
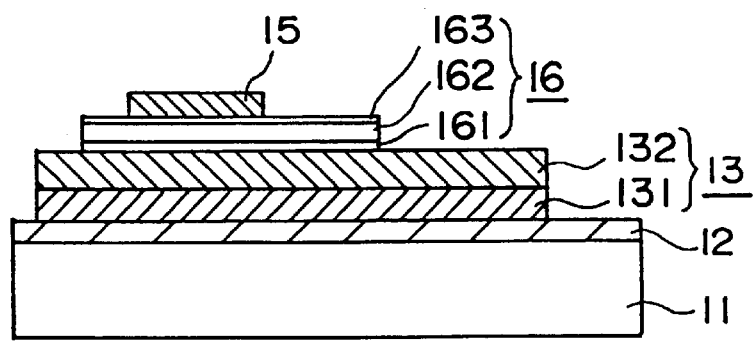
FIG. 10 is a sectional view showing another capacitor structure according to another embodiment of the present invention.

In the above embodiment, the two-layered PLZT film formed by laminating two layers having different face orientations, i.e., the PLZT film 141 with the face orientation (111) and the PLZT film 142 with the face orientation (100) has been employed as the capacitor insulating film 14. However, as shown in FIG. 10, three or more-layered PLZT film formed by laminating PLZT films 161, 162 with the face orientation (111) and a PLZT film 162 with the face orientation (100) may be employed as the capacitor insulating film 16. In FIG. 10, as for other references, the same references as those in FIGS. 2A and 2B denotes the same parts or elements shown in FIGS. 2A and 2B.

Next, an example in which the above capacitor is applied to a semiconductor memory device will be explained with reference to FIG. 11 hereunder.

Figure 11:
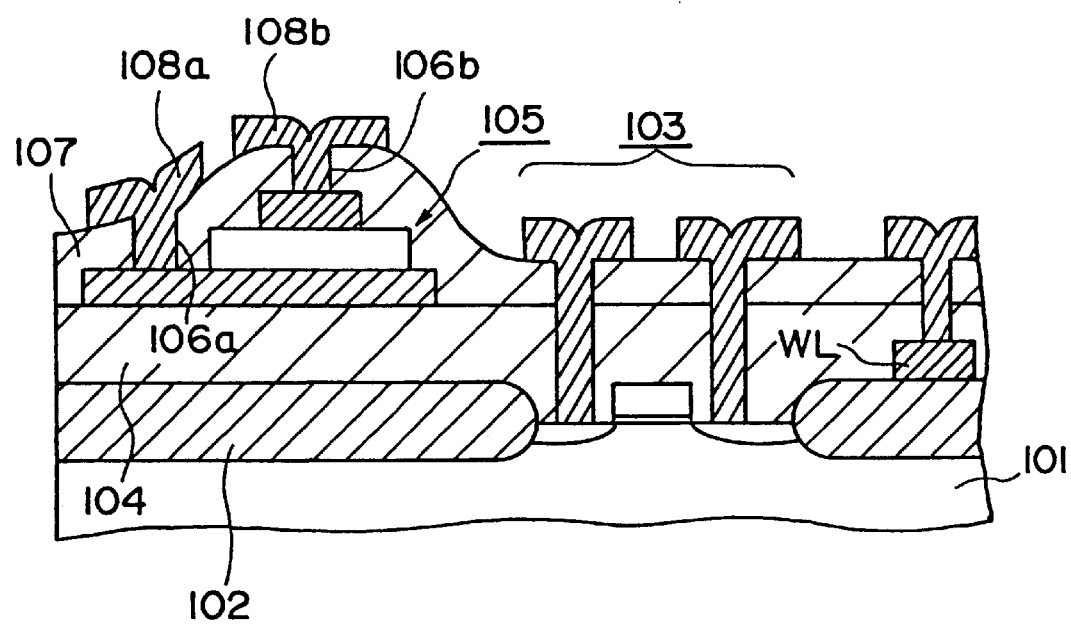
FIG. 11 is a sectional view showing an example in which the capacitor according to another embodiment of the present invention is applied to a semiconductor memory device.

As shown in FIG. 11, a field insulating film 102 is formed on a silicon substrate 101 and then an insulated gate FET 103 is formed on the silicon substrate 101 between the field insulating film 102. An interlayer insulating film 104 is formed to cover the insulated gate FET 103 and then a capacitor 105 is formed on the interlayer insulating film 104.

The capacitor 105 is covered with an insulating film 107 and then a leading electrode 108a is connected to a lower electrode of the capacitor 105 through a via hole 106a formed in the insulating film 107. Also, a leading electrode 108b is connected to an upper electrode through another via hole 106b formed in the insulating film 107.

As stated above, according to the semiconductor memory device having the capacitor according to the embodiment of the present invention, an outflow of charges can be suppressed because the capacitor has the small leakage current. In addition, since the polarization width is large, the dielectric constant of the capacitor insulating film can be enhanced and miniaturization of the device can be achieved by reducing the capacitor area.

As described above, in the present invention, the capacitor insulating film formed by laminating the ferroelectrics film including Pb having the face orientation (111) and the ferroelectrics film including Pb having the face orientation (100) has been employed.

According to the experiment, in the ferroelectrics film including Pb having the face orientation (111), the leakage current is large but the polarization width also becomes large. In contrast, in the ferroelectrics film including Pb having the face orientation (100), the polarization width is small but the leakage current also becomes small.

Therefore, since the capacitor formed by laminating these ferroelectrics films includes the ferroelectrics film having the face orientation (111), it has the large polarization width. Also, the ferroelectrics film having the face orientation (111) has the large leakage current if it is employed solely in the capacitor. The defect of the ferroelectrics film having the face orientation (111), i.e., the ferroelectrics film has the large leakage current, can be compensated by laminating the ferroelectrics film having the face orientation (111) and the ferroelectrics film having the face orientation (100), so that the leakage current can be reduced smaller in the overall capacitor.

With the above, the capacitor having the large polarization width can be formed while reducing the leakage current smaller.

Accordingly, in the semiconductor memory device having such capacitor, an outflow of charges can be suppressed because the capacitor has the small leakage current. In addition, since the polarization width is large, the dielectric constant of the capacitor insulating film can be enhanced and also miniaturization of the device can be achieved by reducing the capacitor area.

What is claimed is:

1. A method of manufacturing a semiconductor device comprising the steps of:

forming an insulating film on a semiconductor substrate;

forming a lower electrode made of a refractory metal having a face orientation (111) on the insulating film;

forming a first ferroelectrics film including Pb having the face orientation (111) on the lower electrode, forming at least a second ferroelectrics film including Pb having the face orientation (100) on the first ferroelectrics film, and forming a capacitor insulating film made of at least two layered ferroelectrics films having different face orientations;

forming an upper electrode made of the refractory metal on the capacitor insulating film; and forming a capacitor by patterning the upper electrode, the capacitor insulating film, and the lower electrode.

2. A method of manufacturing a semiconductor device according to claim 1, wherein a ratio of elements including Pb oriented at A sites of a perovskite crystal structure, which are constituent elements of the ferroelectrics film, to other constituent elements is in a range of 0.9 to 1.4.

3. A method of manufacturing a semiconductor device according to claim 1, wherein a ratio of elements including Pb oriented at the A sites relative to other constituent elements is more than one in the ferroelectrics film including Pb having the face orientation (100), and a ratio of elements including Pb oriented at the A sites relative to other constituent elements is less than one in the ferroelectrics film including Pb having the face orientation (111).

4. A method of manufacturing a semiconductor device according to claim 1, wherein a plurality of ferroelectrics films having different face orientations are formed by sputtering, and face orientations of the ferroelectrics films are controlled by adjusting an Ar gas pressure as a sputtering gas.

5. A method of manufacturing a semiconductor device according to claim 1, wherein a plurality of ferroelectrics films having different face orientations are formed by sputtering, and face orientations of the ferroelectrics films are controlled by adjusting a high frequency power to plasmanize the sputtering gas.

6. A method of manufacturing a semiconductor device according to claim 1, wherein material of the first ferroelectrics film and the second ferroelectrics film is $Pb(Zr,Ti)O_3$ or $(Pb,La)(Zr,Ti)O_3$.

7. A method of manufacturing a semiconductor device according to claim 1, wherein material of the lower electrode and the upper electrode provided in contact with the first ferroelectrics film and the second ferroelectrics film is a Pt film.

8. A method of manufacturing a semiconductor device according to claim 2, wherein a plurality of ferroelectrics films having different face orientations are formed by sputtering and face orientations of the ferroelectrics films are controlled by adjusting an Ar gas pressure as a sputtering gas.

9. A method of manufacturing a semiconductor device according to claim 3, wherein a plurality of ferroelectrics films having different face orientations are formed by sputtering, and face orientations of the ferroelectrics films are controlled by adjusting an Ar gas pressure as a sputtering gas.

10. A method of manufacturing a semiconductor device according to claim 2, wherein a plurality of ferroelectrics films having different face orientations are formed by sputtering, and face orientations of the ferroelectrics films are controlled by adjusting a high frequency power to plasmanize the sputtering gas.

11. A method of manufacturing a semiconductor device according to claim 3, wherein a plurality of ferroelectrics films having different face orientations are formed by sputtering, and face orientations of the ferroelectrics films are controlled by adjusting a high frequency power to plasmanize the sputtering gas.

12. A method of manufacturing a semiconductor device according to claim 2, wherein material of the first ferroelectrics film and the second ferroelectrics film is $Pb(Zr, Ti)O_3$ or $(Pb, La)(Zr, Ti)O_3$.

13. A method of manufacturing a semiconductor device according to claim 3, wherein material of the first ferroelectrics film and the second ferroelectrics film is $Pb(Zr, Ti)O_3$ or $(Pb, La)(Zr, Ti)O_3$.

14. A method of manufacturing a semiconductor device according to claim 4, wherein material of the first ferroelectrics film and the second ferroelectrics film is $Pb(Zr, Ti)O_3$ or $(Pb, La)(Zr, Ti)O_3$.

15. A method of manufacturing a semiconductor device according to claim 5, wherein material of the first ferroelectrics film and the second ferroelectrics film is $Pb(Zr, Ti)O_3$ or $(Pb, La)(Zr, Ti)O_3$.

16. A method of manufacturing a semiconductor device according to claim 2, wherein material of the lower electrode and the upper electrode provided in contact with the first ferroelectrics film and the second ferroelectrics film is a Pt film.

17. A method of manufacturing a semiconductor device according to claim 3, wherein material of the lower electrode and the upper electrode provided in contact with the first ferroelectrics film and the second ferroelectrics film and the second ferroelectrics film is a Pt film.

18. A method of manufacturing a semiconductor device according to claim 4, wherein material of the lower electrode and the upper electrode provided in contact with the first ferroelectrics film and the second ferroelectrics film is a Pt film.

19. A method of manufacturing a semiconductor device according to claim 5, wherein material of the lower electrode and the upper electrode provided in contact with the first ferroelectrics film and the second ferroelectrics film is a Pt film.

20. A method of manufacturing a semiconductor device according to claim 6, wherein material of the lower electrode and the upper electrode provided in contact with the first ferroelectrics film and the second ferroelectrics film is a Pt film.

* * * * *